(12) United States Patent  (10) Patent No.: US 7,378,831 B1
Jenkins et al.  (45) Date of Patent: May 27, 2008

(54) SYSTEM AND METHOD FOR DETERMINING A DELAY TIME INTERVAL OF COMPONENTS

(75) Inventors: Keith A. Jenkins, Sleepy Hollow, NY (US); Seongwon Kim, Old Tappan, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/624,392

(22) Filed: Jan. 18, 2007

(51) Int. Cl.
*G01R 19/00* (2006.01)
*G01R 29/02* (2006.01)
*H03H 11/26* (2006.01)

(52) U.S. Cl. .................... 324/76.11; 327/276; 702/79
(58) Field of Classification Search ............ 324/76.11, 324/76.35, 76.54; 327/261, 270, 276, 277, 327/252, 263, 269, 149, 271, 158, 250, 284, 327/395, 400; 702/79, 89; 361/28, 91.3, 361/75, 83, 89, 94, 195
See application file for complete search history.

(56) References Cited

U.S. PATENT DOCUMENTS

| | | | |
|---|---|---|---|
| 4,849,702 A * | 7/1989 | West et al. ................. 327/160 |
| 5,216,301 A | 6/1993 | Gleeson, III et al. |
| 5,420,531 A | 5/1995 | Wetlaufer |
| 5,465,065 A | 11/1995 | Stevens |
| 6,127,869 A | 10/2000 | Hirasaka |
| 6,566,927 B2 * | 5/2003 | Park et al. ................. 327/211 |
| 6,696,875 B1 | 2/2004 | Arkas et al. |
| 6,995,591 B2 * | 2/2006 | Lee ........................... 327/158 |
| 7,304,510 B2 * | 12/2007 | Matsuta ........................ 327/3 |
| 2003/0106361 A1 | 6/2003 | Greidanus et al. |
| 2004/0183517 A1 * | 9/2004 | Reilly et al. ............. 324/76.11 |
| 2007/0085570 A1 * | 4/2007 | Matsuta ........................ 327/3 |

* cited by examiner

*Primary Examiner*—Diego Gutierrez
*Assistant Examiner*—Hoai-An D. Nguyen
(74) *Attorney, Agent, or Firm*—Cantor Colburn LLP; Jesse Abzug

(57) ABSTRACT

A system and a method for determining a delay time interval of components are provided. The system includes a delay chain of components having a plurality of components wherein each component of the delay chain of components has a first delay time interval. The system utilizes a reference clock signal to stimulate the delay change of components and monitors a delay clock signal output by the delay chain of components to determine a delay time interval associated with each component in the delay chain of components.

5 Claims, 7 Drawing Sheets

SYSTEM AND METHOD FOR DETERMINING A DELAY TIME INTERVAL OF COMPONENTS

FIELD OF THE INVENTION

This application relates to a system and a method for determining a delay time interval of components.

BACKGROUND OF INVENTION

Input/output circuits have utilized delay chains to delay an incoming signal by a known amount. Delay is achieved by transmitting a signal through a concatenated chain of finite delay elements, or stages. However, the delay per stage is not known precisely. In other words, the predicted delay per stage does not correspond to the actual delay per stage. This uncertainty is particularly large in new technologies, making it difficult to design the correct chain length. If too short of a chain is utilized, a chain leads to non-working interface circuit.

Accordingly, the inventors herein have recognized a need for a system for determining a delay time interval of each component utilized in a delay chain of components.

SUMMARY OF INVENTION

A system for determining a delay time interval of components in accordance with an exemplary embodiment is provided. The system includes a delay chain of components having a plurality of components wherein each component of the delay chain of components has a first delay time interval. The delay chain of components are configured to utilize a selected number of components thereof to output the delayed clock signal after the delay chain of components receives the first clock signal. The system further includes a processor operably communicating with the delay chain of components configured to specify a number of components of the delay chain of components to be activated. The system further includes a latch having a clock terminal, a data terminal, and an output terminal, the first clock signal being input into both the clock terminal and the delay chain of components. The data terminal receives the delayed clock signal from the delay chain of components. The system further includes a circuit operably coupled to the output terminal of the latch configured to determine whether an output signal from the output terminal has a high logic value or a low logic value. The circuit is further operably coupled to the processor. The processor is further configured to iteratively increase a selected number of the components of the delay chain of components to be activated, for increasing a delay time interval between the delayed clock signal and the first clock signal, until the circuit determines that the output signal from the latch has a low logic value. The selected number is a first selected number when the output signal has the low logic value. The processor is further configured to iteratively increase the selected number of the components of the delay chain of components to be activated, for increasing the delay time interval between the delayed clock signal and the first clock signal, until the circuit determines that the output signal from the latch has a high logic value. The selected number is a second selected number when the output signal has the high logic value. The processor is further configured to calculate the first delay time interval based on the first selected number and the second selected number.

A method for determining a delay time interval of components in accordance with another exemplary embodiment is provided. The method includes receiving a first clock signal at a delay chain of components having a plurality of components wherein each component of the delay chain of components has a first delay time interval. The delay chain of components is configured to utilize a selected number of the components thereof to output a delayed clock signal after the delay chain of components receives the first clock signal. The method further includes sending a second signal from a processor to the delay chain of components indicating a number of the components of the delay chain of components to be activated. The method further includes receiving the first clock signal at a latch. The latch has a clock terminal, a data terminal, and an output terminal. The first clock signal is input into the clock terminal. The data terminal receives the delayed clock signal from the delay chain of components. The method further includes receiving an output signal from the output terminal at a circuit operably coupled to the output terminal of the latch. The circuit is configured to determine whether the output signal has a high logic value or a low logic value. The circuit is further operably coupled to the processor. The method further includes iteratively increasing a selected number of the components of the delay chain of components to be activated utilizing the processor, for increasing a delay time interval between the delayed clock signal and the first clock signal, until the circuit determines that the output signal from the latch has a low logic value. The selected number is a first selected number when the output signal has the low logic value. The method further includes iteratively increasing the selected number of the components of the delay chain of components to be activated utilizing the processor, for increasing the delay time interval between the delayed clock signal and the first clock signal, until the circuit determines that the output signal from the latch has a high logic value. The selected number is a second selected number when the output signal has the high logic value. The method further includes calculating the first delay time interval for each component of the delay chain of components utilizing the processor, based on the first selected number and the second selected number.

DESCRIPTION OF EMBODIMENTS

Figure 1:
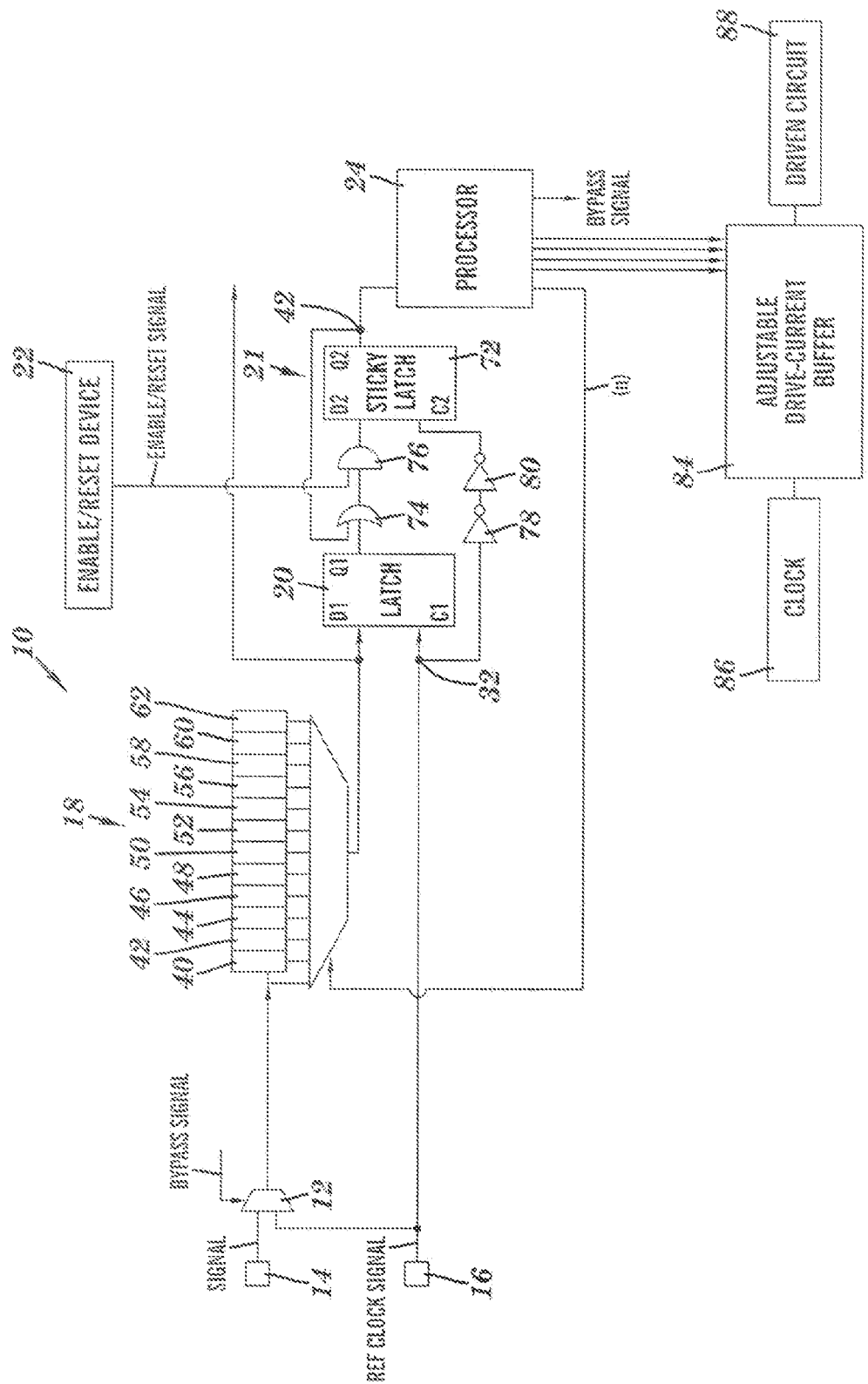
FIG. 1 is a block diagram of a system for determining a delay time interval of components in accordance with an exemplary embodiment.

Referring to FIG. 1, a system 10 for automatically determining a delayed time interval of components is illustrated.

The system 10 includes a switch 12, a signal generator 14, a clock 16, a delay chain of components 18, a circuit 21, an enable/reset device 22, a processor 24, a clock 86, an adjustable drive-current buffer 84, and a driven circuit 88.

The switch 12 is provided to either route a reference clock signal from the clock 16 to the delay chain of components 18 or a signal from the signal generator 14 to the delay chain of components 18. When the switch 12 receives a bypass signal from the processor 24, the switch 12 will route the reference clock signal from the clock 16 to the delay chain of components 18. Alternately, when the switch 12 does not receive the bypass signal from the processor 24, the switch 12 will route the signal from the signal generator 14 to the delay chain of components 18. For purposes of understanding, when the system 10 is determining a delay time interval of components as described in further detail below, the switch 12 will only allow the reference clock signal to propagate to the delay chain of components 18.

Figure 3:
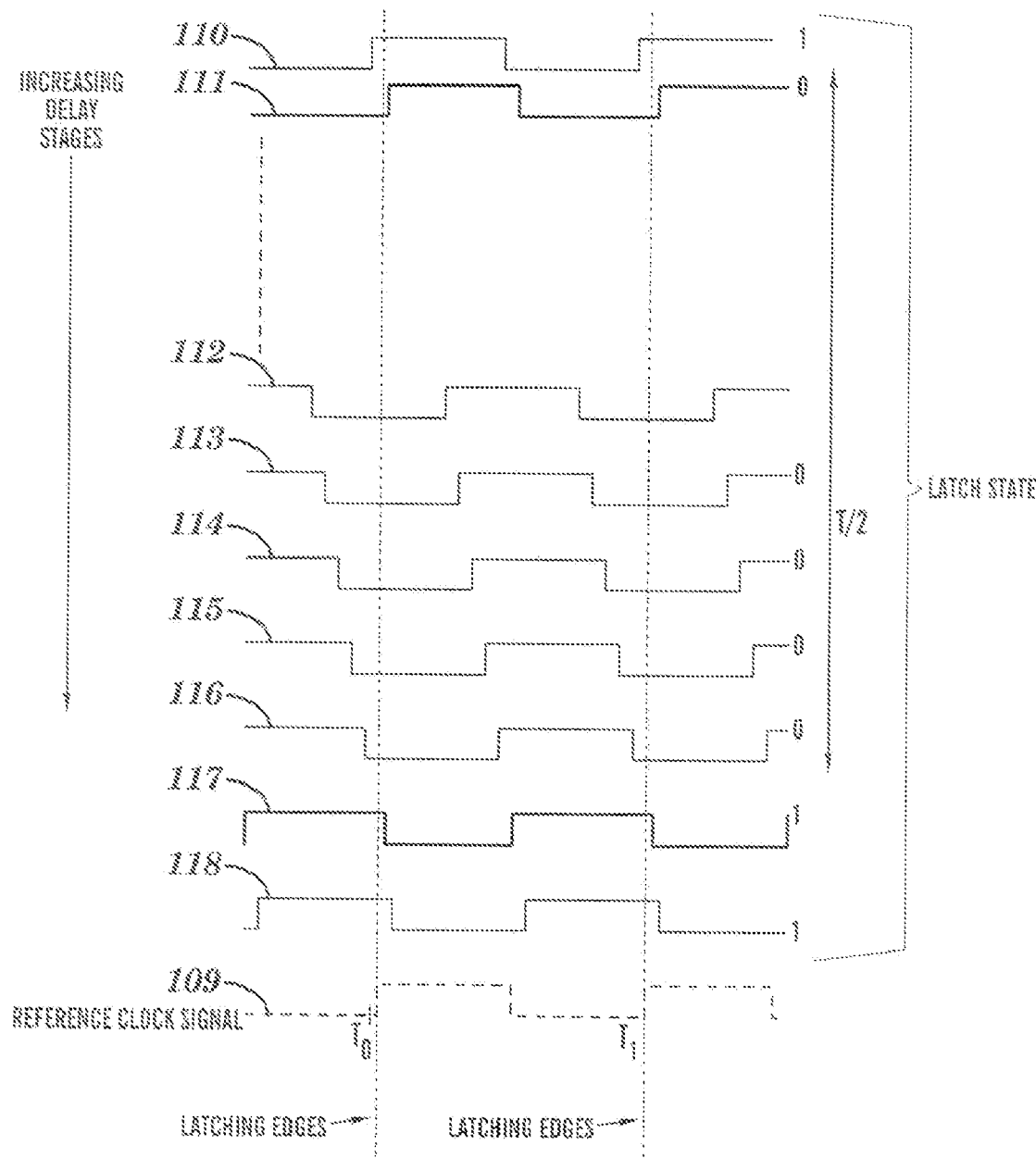
FIG. 3 illustrates a plurality of signal schematics associated with signals generated by the system of FIG. 1.

The clock 16 is provided to generate a reference clock signal for determining a delay time interval associated with each of the components of the delay chain of components 18. Referring to FIG. 3, in one exemplary embodiment, the clock 16 generates the reference clock signal 109. The reference clock signal 109 has a predetermined period or time interval for each cycle. The clock 16 is electrically coupled to the switch 12, a clock terminal (C) of the latch 20, and to an input terminal of the inverter 78.

The delay chain of components 18 are provided to allow an adjustment of a delay time interval between the reference clock signal and a delay clock signal output by the delay chain of components 18. The delay chain of components 18 includes components 40, 42, 44, 46, 48, 50, 52, 54, 56, 58, 60, 62 which are electrically coupled in series. Of course, in an alternative embodiment, the delay chain of components 18 can have a different number of components than shown in the exemplary embodiment. The delay chain of components 18 receives a signal from the processor 24, at an input terminal, indicating a number of components of the delay chain of components 18 to be activated for delaying the received reference clock signal. It should be noted that each of the components 40-62 have a delay time interval (t) for propagating a signal through the respective component. For example, when component 40 is the only activated component of the delay chain of components 18, the total delay time interval of the delay chain of components 18 is equal to the delay time interval (t) of the component 40. Further, for example when the components 40, 42 are the only activated components of the delay chain of components 18, the total delay time interval of the delay chain of components 18 is equal to (2*t). The chain of components 18 has an output terminal electrically coupled to the data terminal (D1) of the latch 20. Further, the chain of components 18 outputs a delayed clock signal that is delayed by a total delay time interval of the delay chain of components 18 with respect to the reference clock signal.

The latch 20 is provided to store or latch a binary value corresponding to the delayed clock signal that is output from the delay chain of components 18 when the reference clock signal transitions from a low logic value (e.g., binary 0) to a high logic value (e.g., binary 1). The latch 20 includes a clock terminal (C1), a data terminal (D1), and an output terminal (Q1). The clock terminal (C1) is electrically coupled to the clock 16. The data terminal (D1) is electrically coupled to an output terminal of the delay chain of components 18. The output terminal (Q1) is electrically coupled to an input terminal of the OR gate 74. Further, the latch 20 is an edge-triggered latch.

The circuit 21 is configured to output a binary value having a high logic value whenever the delayed clock signal transitions from a low logic value (e.g., binary 0) to a high logic value (e.g., binary 1). Further, the circuit 21 maintains outputting the binary value having a high logic value after the delayed clock signal transitions from the high logic value to the low logic value, until an enable/reset signal is utilized to reset an output of the circuit 21. The circuit 21 includes a sticky latch 72, an OR gate 74, an AND gate 76, and inverters 78, 80.

The OR gate 74 is configured to output a binary value having a high logic value when either the output signal at the (Q) terminal has a high logic value or an output signal from the sticky latch 72 has a high logic value. Alternately, the OR gate 74 outputs a binary value having a low logic value when both the output signal at the (Q1) terminal has a low logic value and the output signal from the sticky latch 72 has a low logic value. The OR gate 74 has input terminal electrically coupled to the (Q1) terminal of the latch 20 and another input terminal electrically coupled to an output terminal of the sticky latch 72. The OR gate 74 also has an output terminal electrically coupled to an input terminal of the AND gate 76.

The AND gate 76 is configured to output a binary value having a high logic value when both the output signal from the OR gate 70 has a high logic value and the enable/reset signal from the enable/reset device 22 has a high logic value. Alternately, the AND gate 76 is configured to output a binary value having a low logic value when either the output signal from the OR gate 70 has a low logic value or the enable/reset signal from the enable/reset device 22 has a low logic value.

The sticky latch 72 is provided to output a binary value corresponding to the binary value input into the sticky latch 72 whenever a received clock signal transitions from a low logic value to high logic value. The sticky latch 72 has a clock terminal (C2), a data terminal (D2), and an output terminal (Q2). The clock terminal (C2) is electrically coupled to an output terminal of the inverter 80. The data terminal (D2) is electrically coupled to an output terminal of the AND gate 76. The output terminal (Q2) is electrically coupled to the processor 24. In particular, sticky latch 72 is configured to output a binary value corresponding to the binary value input into the data terminal (D2) whenever a received clock signal at clock terminal (C2) transitions from a low logic value to high logic value.

The inverters 78, 80 are electrically coupled in series between a node 32 and the clock terminal (C2) of the sticky latch 72. The inverters 78, 80 have a delay time interval corresponding to the delay time interval of the OR gate 74 and the AND gate 76.

The processor 24 is provided to output a signal to specify a number of components of the delay chain of components 18 to be activated for setting a total delay time interval of the delay chain of components 18. The processor 24 is further configured to calculate a delay time interval for each component of the delay chain of components 18. Further, the processor 24 is configured to calculate a desired selected number of components of the delay chain of components to be activated to obtain a total desired delay time interval between reference clock signal and the delayed clock signal. Further, the processor 24 is configured to generate a bypass signal that induces the switch 12 to route the reference clock signal from the clock 16 to the delay chain of components 18. Still further, the processor 24 is configured to control a number of activated current stages in the adjustable drive-current buffer 84 for controlling an output drive current level applied to the driven circuit 88.

The clock 86 is provided to generate a clock signal that is received by the adjustable drive-current buffer 84. As shown, the clock 86 is electrically coupled to a node 99 of the adjustable drive-current buffer 84.

Figure 2:
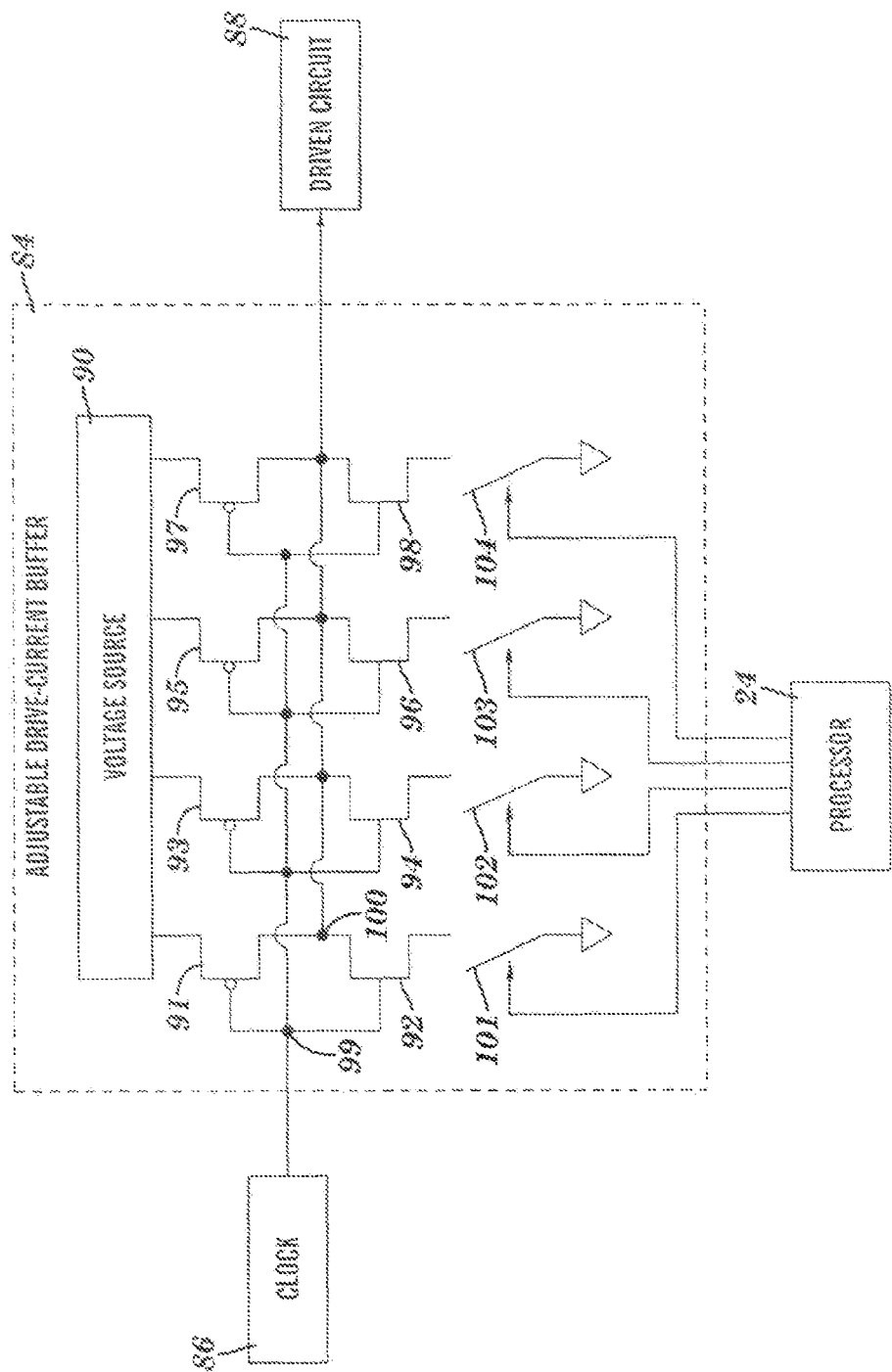
FIG. 2 is an electrical schematic of an adjustable drive-current buffer utilized in the system of FIG. 1.

Referring to FIG. 2, the adjustable drive-current buffer 84 is provided to output a desired output drive current that is received by the driven circuit 88. The adjustable drive-current buffer 84 includes a voltage source 90, transistors 91, 92, 93, 94, 95, 96, 97 and 98, and switches 101, 102, 103 and 104. The transistors 91, 92 are electrically coupled in series between the voltage source 90 and the switch 101. The transistors 91, 92 comprise a first current stage. The activation and de-activation of the transistors 91, 92 is controlled by a clock signal from the clock 86. The operational state of the switch 101 is controlled by the processor 24. The transistors 93, 94 are electrically coupled in series between the voltage source 90 and the switch 102. The transistors 93, 94 comprise a second current stage. The activation and de-activation of the transistors 93, 94 is controlled by a clock signal from the clock 86. The operational state of the switch 102 is controlled by the processor 24. The transistors 95, 96 are electrically coupled in series between the voltage source 90 and the switch 103. The transistors 95, 96 comprise a third current stage. The activation and de-activation of the transistors 95, 96 is controlled by a clock signal from the clock 86. The operational state of the switch 103 is controlled by the processor 24. The transistors 97, 98 are electrically coupled in series between the voltage source 90 and the switch 104. The transistors 97, 98 comprise a fourth current stage. The activation and de-activation of the transistors 97, 98 is controlled by a clock signal from the clock 86. The operational state of the switch 104 is controlled by the processor 24. As shown, each of the current stages is electrically coupled to a node 100 that routes a desired output drive current level to the driven circuit 88.

Referring to FIG. 3, a general overview of a methodology for determining a delay time interval associated with each of the components of the delay chain of components 18 will be explained. Further, a general overview of a methodology for determining a desired selected number of activated components of the delay chain of components 18 will be explained.

When the selected number of components of the delay chain of components 18 equals zero, at time $T_0$ the delayed clock signal 110 arrives at the latch 20 before the reference clock signal 109, and a binary "1" is latched by latch 20. As the number of activated components is increased, the delayed clock signal 94 at the input terminal of the latch 20 lags behind the reference clock signal 109, so a binary "0" is latched. Similarly, as the number of activated components is further increased, the exemplary delayed clock signals 112, 113, 114, 115, 116 lag behind reference clock signal 109, so a binary "0" is latched. When the number of activated components of the delay chain of components 18 is large enough to shift the delayed clock signal 117 by one half of a period of the reference clock signal 109, a binary "1" is again latched. At time $T_1$, the transition from a binary "0" to a binary "1" at the (Q1) output terminal of the latch 20 signifies that the total delay time interval of the delay chain of components 18 is equal to one half of the time period (T) of one cycle of the reference clock signal 109. If the value (n) corresponds to the number of activated components in the delay chain of components 18, at this transition, then the delay time interval per component (t) can be determined utilizing the following equation: $t = T/(2n)$.

Further, a desired selected number of activated components (m) of the delay chain of components 18 can be determined by utilizing the following equation: $m = D/t$, wherein (D) corresponds to a total desired delay time interval of the delay chain of components 18.

Figure 4:
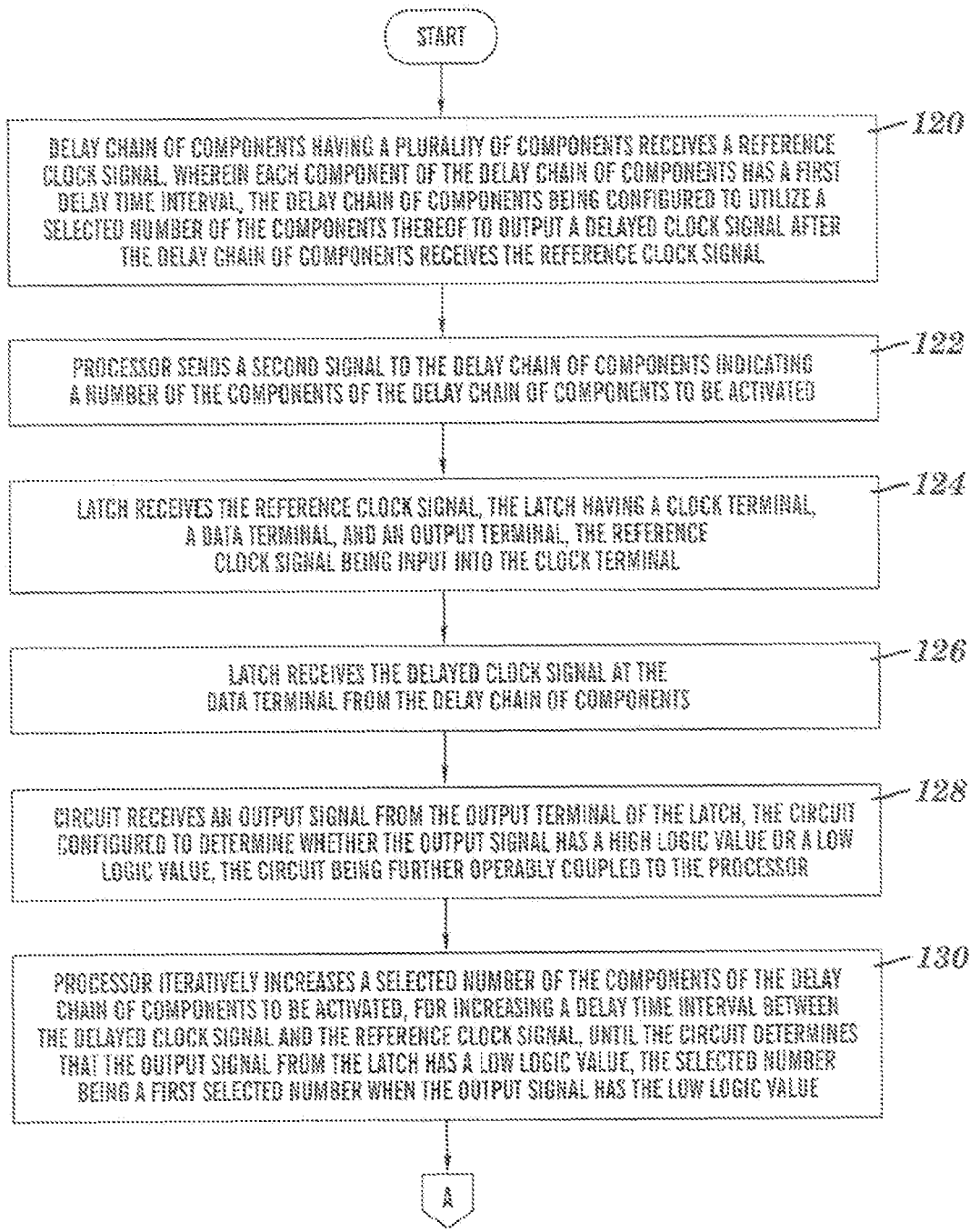
FIGS. 4-6 are flowcharts of a method for determining a delay time interval of components in accordance with another exemplary embodiment.
Figure 5:
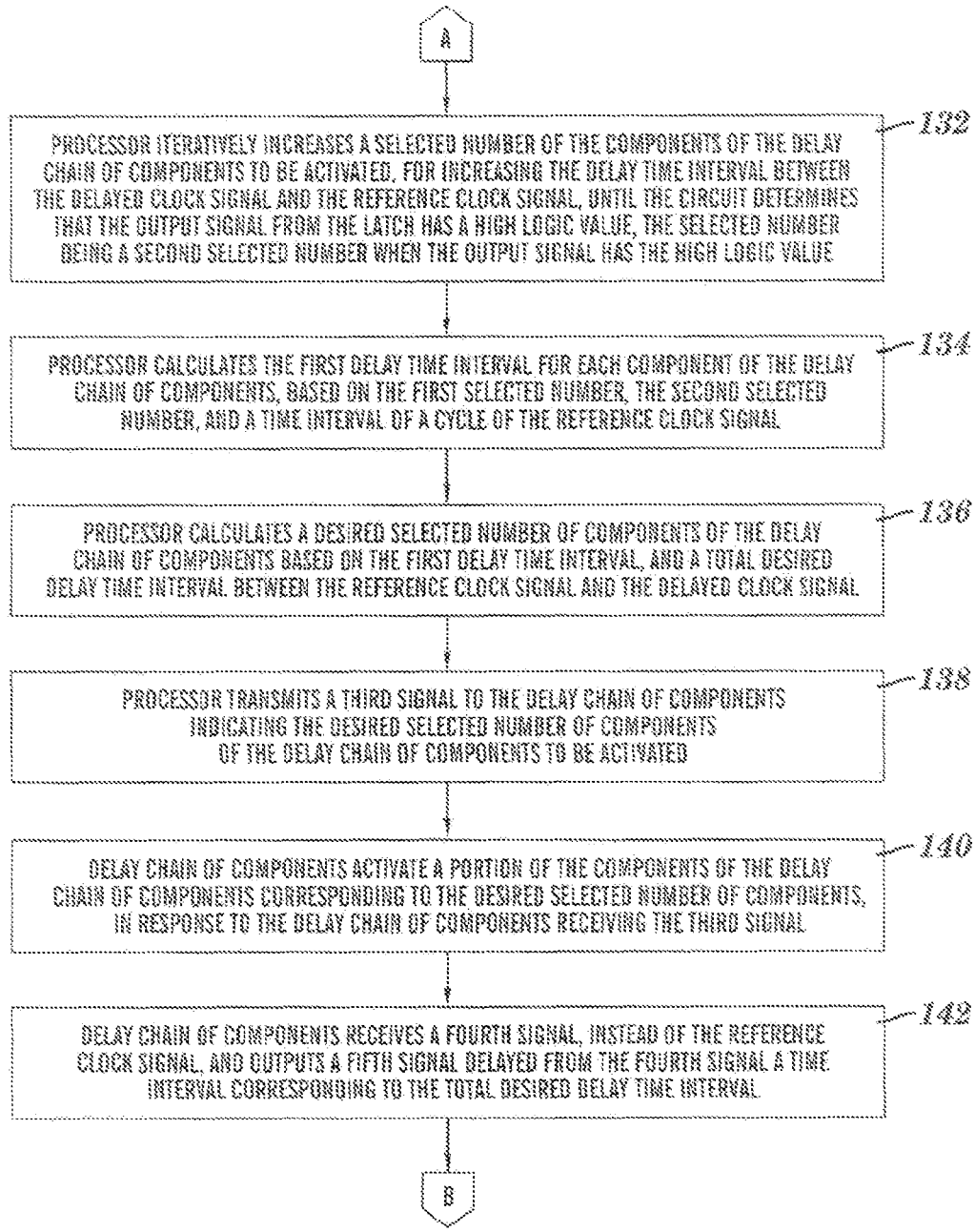
Figure 6:
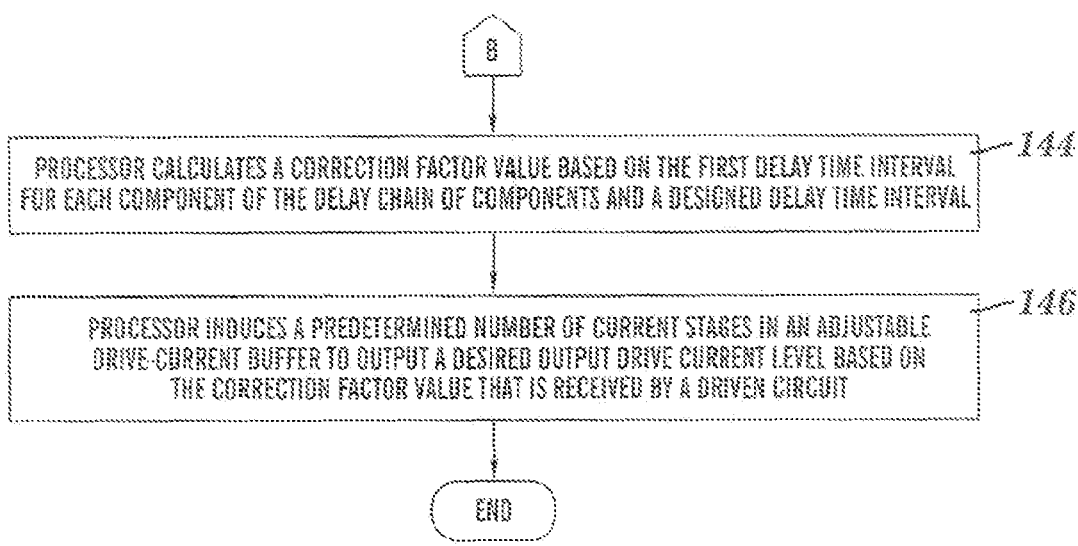

Referring to FIGS. 4-6, a flowchart of a method for determining a delay time interval of components will now be explained. In particular, a delay time interval for each of the components of the delay chain of components 18 will be explained.

At step 120, the delay chain of components 18 having a plurality of components receives a reference clock signal, wherein each component of the delay chain of components 18 has a first delay time interval. The delay chain of components 18 are configured to utilize a selected number of the components thereof to output a delayed clock signal after the delay chain of components receives the reference clock signal.

At step 122, the processor 24 sends a second signal to the delay chain of components 18 indicating a number of the components of the delay chain of components 18 to be activated.

At step 124, the latch 20 receives the reference clock signal. The latch 20 has the clock terminal (C1), the data terminal (D1), and the output terminal (Q1). The reference clock signal is input into the clock terminal (C1).

At step 126, the latch 20 receives the delayed clock signal at the data terminal (D1) from the delay chain of components 18.

At step 128, the circuit 21 receives an output signal from the output terminal (Q1) of the latch 20. The circuit 21 is configured to determine whether the output signal has a high logic value or a low logic value. The circuit 21 is further operably coupled to the processor 24.

At step 130, the processor 24 iteratively increases a selected number of the components of the delay chain of components 18 to be activated, for increasing a delay time interval between the delayed clock signal and the reference clock signal, until the circuit determines that the output signal from the latch 20 has a low logic value. The selected number being a first selected number when the output signal has the low logic value.

At step 132, the processor 24 iteratively increases the selected number of the components of the delay chain of components 18 to be activated, for increasing the delay time interval between the delayed clock signal and the reference clock signal, until the circuit 21 determines that the output signal from the latch 20 has a high logic value. The selected number is a second selected number when the output signal has the high logic value.

At step 134, the processor 24 calculates the first delay time interval for each component of the delay chain of components 18, based on the first selected number, the second selected number, and a time interval of a cycle of the reference clock signal.

At step 136, the processor 24 calculates a desired selected number of components of the delay chain of components 18 based on the first delay time interval, and a total desired delay time interval between the reference clock signal and the delayed clock signal.

At step 138, the processor 24 transmits a third signal to the delay chain of components 18 indicating the desired selected number of components of the delay chain of components 18 to be activated.

At step 140, the delay chain of components 18 activate a portion of the components of the delay chain of components 18 corresponding to the desired selected number of components, in response to the delay chain of components 18 receiving the third signal.

At step 142, the delay chain of components 18 receives a fourth signal, instead of the reference clock signal, and outputs a fifth signal delayed from the fourth signal a time interval corresponding to the total desired delay time interval.

At step 144, the processor 24 calculates a correction factor value based on the first delay time interval for each component of the delay chain of components and a designed delay time interval.

At step 146, the processor 24 induces a predetermined number of current stages in an adjustable drive-current buffer 84 to output a desired output drive current level based on the correction factor value, which is received by a driven circuit 88. After step 146, the method is exited.

Figure 7:
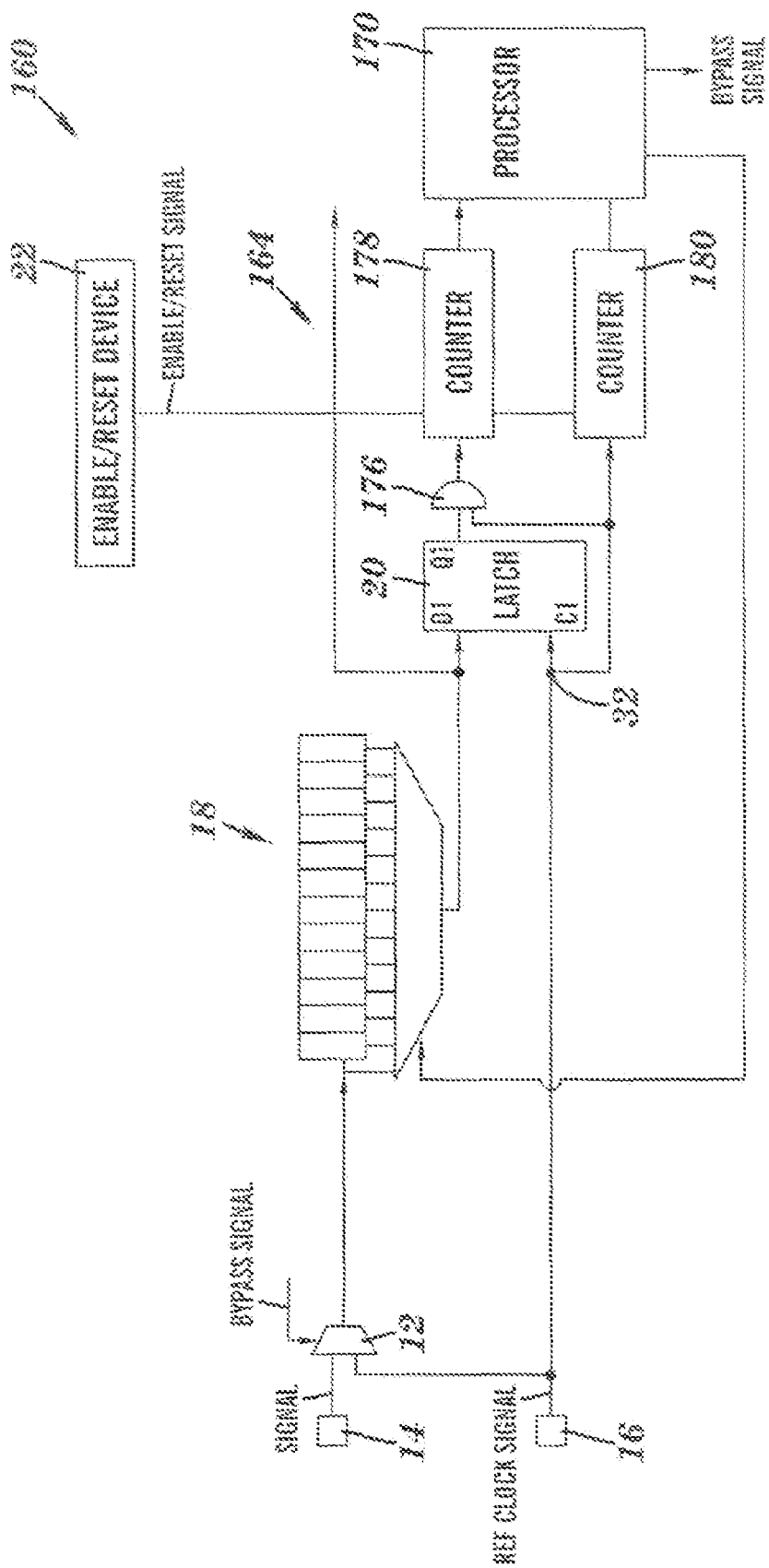
FIG. 7 is a block diagram of another system for determining a delay time interval of components in accordance with another exemplary embodiment.

Referring to FIG. 7, a system 160 for automatically determining a delayed time interval of components in accordance with another exemplary embodiment is illustrated. The system 160 includes the switch 12, the signal generator 14, the clock 16, the delay chain of components 18, a circuit 164, the enable/reset device 22, and a processor 170. The primary difference between the system 160 and the system 10, is that the system 160 utilizes the circuit 164 instead of the circuit 21, and a processor 170 instead of the processor 24. Accordingly, only the circuit 164 and the processor 170 will be described in further detail below.

The circuit 164 is provided to determine an output value that is output by the latch 20. The circuit 164 includes an AND gate 176 and counters 178 and 180. The AND gate 176 has an input terminal electrically coupled to the output terminal (Q1) of the latch 20. The AND gate 176 has another input terminal electrically coupled to the node 32. The AND gate 176 has an output terminal electrically coupled to the counter 178. The counter 178 is electrically coupled between an output terminal of the AND gate 176 and the processor 170. The counter 178 is further electrically coupled to the enable/reset device 22. The counter 180 is electrically coupled between the node 32 and the processor 170.

During operation, the output value output by the latch 20 is "anded" with the reference clock signal and the output of the AND gate 176 is input into the counter 178. Accordingly, the count obtained by the counter 178 corresponds to a number of times that a binary "1" is present at the output terminal (Q1) of the latch 20. The reference clock signal is directly input into the counter 180. Accordingly, the count obtained by the counter 180 corresponds to the number of cycles of the reference clock signal. If the binary value output by the latch 20 is equal to binary "0" over time, the count in the counter 178 will equal zero, and the count obtained by the counter 180 will equal the number of cycles of the reference clock signal. Alternately, if the binary value output by the latch 20 is equal to binary "1" over time, the count in the counter 178 will equal the count in the counter 180.

The processor 170 is provided to output a signal to specify a number of components of the delay chain of components 18 to be activated for setting a total delay time interval of the delay chain of components 18. The processor 170 is further configured to calculate a delay time interval for each component of the delay chain of components 18, utilizing the counts in both the counter 178 and the counter 180. Further, the processor 170 is configured to calculate a desired selected number of components of the delay chain of components to be activated to obtain a total desired delay time interval between reference clock signal and the delayed clock signal. Further, the processor 170 is configured to generate a bypass signal that induces the switch 12 to route the reference clock signal from the clock 16 to the delay chain of components 18.

The system and the method for determining a delay time interval of components provides a substantial advantage over other methods. In particular, the system and the method provide a technical effect of determining a delay time interval of each component utilized in a delay chain of components.

While the invention is described with reference to an exemplary embodiment, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another.

We claim:

1. A method for determining a delay time interval of components, comprising:

receiving a first clock signal at a delay chain of components having a plurality of components wherein each component of the delay chain of components has a first delay time interval, the delay chain of components being configured to utilize a selected number of the components thereof to output a delayed clock signal after the delay chain of components receives the first clock signal;

sending a second signal from a processor to the delay chain of components indicating a number of the components of the delay chain of components to be activated;

receiving the first clock signal at a latch, the latch having a clock terminal, a data terminal, and an output terminal, the first clock signal being input into the clock terminal, the data terminal receiving the delayed clock signal from the delay chain of components;

receiving an output signal from the output terminal at a circuit operably coupled to the output terminal of the latch, the circuit configured to determine whether the output signal has a high logic value or a low logic value, the circuit being further operably coupled to the processor;

iteratively increasing a selected number of the components of the delay chain of components to be activated utilizing the processor, for increasing a delay time interval between the delayed clock signal and the first clock signal, until the circuit determines that the output signal from the latch has a low logic value, the selected number being a first selected number when the output signal has the low logic value;

iteratively increasing the selected number of the components of the delay chain of components to be activated utilizing the processor, for increasing the delay time interval between the delayed clock signal and the first clock signal, until the circuit determines that the output signal from the latch has a high logic value, the selected number being a second selected number when the output signal has the high logic value;

calculating the first delay time interval for each component of the delay chain of components utilizing the processor, based on the first selected number and the second selected number.

2. The method of claim 1, wherein the calculating the first delay time interval comprises calculating the first delay time interval utilizing the processor, based on the first selected number, the second selected number, and a time interval of a cycle of the first clock signal.

3. The method of claim 1, further comprising calculating a desired selected number of components of the delay chain of components based on the first delay time interval, and a total desired delay time interval between the first clock signal and the delayed clock signal.

4. The method of claim 3, further comprising:

transmitting a third signal from the processor to the delay chain of components indicating the desired selected number of components of the delay chain of components to be activated; and activating a portion of the components of the delay chain of components corresponding to the desired selected number of components, in response to the delay chain of components receiving the third signal.

5. The method of claim 1, further comprising inducing an adjustable drive-current buffer operably coupled to the processor to output a desired output current level based on the first delay time interval.

* * * * *